(12) United States Patent
Wu et al.

(10) Patent No.: US 10,566,945 B2
(45) Date of Patent: Feb. 18, 2020

(54) NOISE SUPPRESSION DEVICE AND EQUIVALENT CIRCUIT THEREOF

(71) Applicant: NATIONAL TAIWAN UNIVERSITY, Taipei (TW)

(72) Inventors: Tzong-Lin Wu, Taipei (TW); Ying-Cheng Tseng, Taipei (TW)

(73) Assignee: National Taiwan University, Taipei (TW)

( * ) Notice: Subject to any disclaimer, the term of this patent is extended or adjusted under 35 U.S.C. 154(b) by 103 days.

(21) Appl. No.: 15/795,764

(22) Filed: Oct. 27, 2017

(65) Prior Publication Data
US 2018/0316332 A1   Nov. 1, 2018

(30) Foreign Application Priority Data
Apr. 27, 2017   (TW) .............................. 106114139 A

(51) Int. Cl.
H03H 7/06 (2006.01)
H03H 7/01 (2006.01)
H03H 1/00 (2006.01)

(52) U.S. Cl.
CPC ............ *H03H 7/1758* (2013.01); *H03H 1/00* (2013.01); *H03H 7/06* (2013.01); *H03H 2001/0021* (2013.01)

(58) Field of Classification Search
CPC ......... H03H 2001/0085; H03H 1/0007; H03H 7/06; H03H 7/1758
USPC .................................................. 333/181, 185
See application file for complete search history.

(56) References Cited

U.S. PATENT DOCUMENTS

| 6,061,227 A * | 5/2000 | Nogi ...................... H01G 4/385 333/185 |
| 8,121,544 B2 | 2/2012 | Shimizu et al. |
| 8,595,924 B2 | 12/2013 | McKinzie, III |
| 8,994,470 B2 | 3/2015 | Sakai |

(Continued)

FOREIGN PATENT DOCUMENTS

| TW | I476787 B | 3/2015 |
| TW | I483453 B | 5/2015 |
| TW | I530093 B | 4/2016 |

OTHER PUBLICATIONS

Yen-Ju Lin, Ying-Cheng Tseng, and Tzong-Lin Wu, "A Resonator-Based Suppressor for Mitigating the Noise Transfer on Metal Plates for Control of Electromagnetic Interference", IEEE Microwave and Wireless Components Letters, vol. 26, No. 11, Nov. 2016.

*Primary Examiner* — Rakesh B Patel
(74) *Attorney, Agent, or Firm* — Rosenberg, Klein & Lee

(57) ABSTRACT

The present invention provides a noise suppression device and equivalent circuit thereof. The noise suppression device comprises a metal plate and at least one first resonance unit. The first resonance unit comprises a plurality of first resonators. Each of the first resonators comprises a first metal segment and at least one first conductive connection segment, the first metal segment is connected to the first conductive connection segment. When the first resonance unit is configured on the metal plate, each of the first metal segments is electrically connected to the metal plate by the corresponding first conductive connection segment. When the resonance of the first resonator occurs, a noise transmitted on the metal plate can be conducted to the first resonator and suppressed by the first resonator.

22 Claims, 16 Drawing Sheets

(56) References Cited

U.S. PATENT DOCUMENTS

| | | |
|---|---|---|
| 8,994,477 B2 | 3/2015 | Wu et al. |
| 9,257,955 B2 | 2/2016 | Wu et al. |
| 2007/0035355 A1 | 2/2007 | Chao |
| 2014/0132371 A1 | 5/2014 | Hankui |
| 2015/0041185 A1 | 2/2015 | Chiu et al. |

* cited by examiner

NOISE SUPPRESSION DEVICE AND EQUIVALENT CIRCUIT THEREOF

This non-provisional application claims priority claim under 35 U.S.C. § 119 (a) on Taiwan Patent Application No. 106114139 filed Apr. 27, 2017, the entire contents of which are incorporated herein by reference.

FIELD OF THE INVENTION

The present invention is related to a suppression device and equivalent circuit thereof, particularly to a suppression device and equivalent circuit thereof for suppressing a noise.

BACKGROUND

With the development of science and technology, the transmission speed of the signal is faster. When the signal traces passes through a discontinuous structure or non-ideal circuit structures, for example, holes passed through multi-layered, blended signal trajectory, and the interface connector, it will easily generate noises, and therefore cause serious electromagnetic interference (EMI) or radio frequency interference (RFI). When the EMI or RFI occurs, the operation of the electrical elements within the electrical product will be affected.

To solve the problem of EMI, in the past, it is more common to use an electromagnetic material, for example, common-mode choke (CMC), in which the feature of high inductance of electromagnetic material is used to suppress the generation of EMI. However, the permeability of the electromagnetic material attenuates quickly in high frequency, in which condition makes the electromagnetic material not suitably in high-speed transmission interface with frequency section of GHz or above.

In view of the above, the present invention is provided with a novel noise suppression device, which has a higher noise suppressing ability, and can easily adjust the target frequency band to be suppressed, it will be the object to be achieved by the present invention.

SUMMARY

It is one object of the present invention to provide a noise suppression device, which comprises a metal plate and at least one resonance unit having a plurality of resonators, the resonance unit is connected to the metal plate, when the resonance unit occurs resonant, a noise transmitted by the metal plate will be conducted to the resonance unit and suppressed by the resonance unit.

It is another object of the present invention to provide a noise suppression device, wherein each of the resonators of the resonance unit is configured with at least one resistor, when the noise transmitted on the metal plate is conducted to the resonance unit, the energy of the noise will be absorbed or dissipated by the resistors of the resonance unit.

It is another object of the present invention to provide a noise suppression device, wherein the noise suppression device is provided at an input end thereof with a resonance unit of an absorption type, and provided at an output end thereof with other resonance unit of an absorption type, accordingly, the noise suppression device can achieve the effect for bidirectional absorbing the noise via the resonance units provided at the input end and the output end.

For achieving above objects, the present invention provides a noise suppression device, which is applied in an electronic product, the noise suppression device comprising: a metal plate, being as a noise transmission path, and connected to a ground of the electronic product; and at least one first resonance unit comprising a plurality of first resonator, each of the first resonators comprising a first metal segment and a first conductive connection segment that is connected to the first metal segment, wherein when the first resonance unit is configured on the metal plate, each of the first metal segments is connected to the metal plate via the corresponding first conductive connection segment; wherein when the first resonators occur resonant, a noise transmitted on the metal plate will be conducted to the first resonators and suppressed by the first resonators.

In one embodiment of the present invention, wherein the first resonance unit further comprises a first substrate, the first metal segments are disposed on a surface of the first substrate, the first conductive connection segments are passing through the first substrate, the first resonance unit is configured on the metal plate via the first substrate.

In one embodiment of the present invention, wherein the first resonance unit is a dismountable element, the first resonance unit is fixed on the metal plate by a way of pasting, or by at least one fixed element.

In one embodiment of the present invention, wherein an upper surface and a lower surface of the metal plate are provided with the at least one first resonance unit, respectively.

In one embodiment of the present invention, wherein at least one first resistor is disposed on each of the first metal segments.

In one embodiment of the present invention, the noise suppression device further comprises at least one second resonance unit, the second resonance unit comprises a plurality of second resonator, each of the second resonators comprises a second metal segment and a second conductive connection segment that is connected to the second metal segment, each of the second metal segments is connected to the metal plate via the corresponding second conductive connection segment when the second resonance unit is configured on the metal plate, the noise transmitted on the metal plate will be conducted to the second resonators and suppressed by the second resonators when the second resonators occur resonant.

In one embodiment of the present invention, wherein the second resonance unit comprises a second substrate, the second metal segments are disposed on a surface of the second substrate, the second conductive connection segments are passing through the second substrate, the second resonance unit is configured on the metal plate via the second substrate.

In one embodiment of the present invention, wherein the noise suppression device further comprises a substrate, the first metal segments the second metal segments are disposed on a surface of the substrate, the first conductive connection segments and the second conductive connection segments are passing through the substrate, the first resonance unit and the second resonance unit are configured on the metal plate via the substrate.

In one embodiment of the present invention, the noise suppression device further comprises at least one third resonance unit, the third resonance unit comprises a plurality of third resonator, each of the third resonators comprises a third metal segment and a third conductive connection segment that is connected to the third metal segment, at least one third resistor is disposed on each of the third metal segments, each of the third metal segments is connected to the metal plate via the corresponding third conductive connection segment when the third resonance unit is configured on the metal plate, the noise transmitted on the metal plate will be conducted to the third resonators and suppressed by the third resonators when the third resonators occur resonant.

In one embodiment of the present invention, where the third resonance unit comprises a third substrate, the third metal segments are disposed on a surface of the third substrate, the third conductive connection segments are passing through the third substrate, the third resonance unit is configured on the metal plate via the third substrate.

In one embodiment of the pre en invention, the third substrate is a soft substrate or a flexible substrate.

In one embodiment of the present invention, wherein the noise suppression device further comprises a substrate, the first metal segments the second metal segments, and the third metal segments are disposed on a surface of the substrate, the first conductive connection segments, the second conductive connection segments, and the third conductive connection segments are passing through the substrate, the first resonance unit, the second resonance unit, and the third resonance unit are configured on the metal plate via the substrate.

In one embodiment of the present invention, the substrate is a soft substrate or a flexible substrate.

In one embodiment of the present invention, wherein the second resonance unit or the third resonance unit is a dismountable element, the second resonance unit or the third resonance unit is fixed on the metal plate by a way of pasting, or by at least one fixed element.

The present invention further provides an equivalent circuit of a noise suppression device, comprising: a first equivalent transmission line model, comprising: a first master transmission conductor, connected at one port thereof to an input end, and connected at other port thereof to an output end; and a first slave transmission conductor, which is disposed on a return path; and at least one first resonance circuit model comprising a first inductor and a first capacitor, the first inductor and the first capacitor are connected in series between the input end and the return path, connected in series between the output end and the return path, or connected in series between the first master transmission conductor and the first slave transmission conductor; wherein when the first resonance circuit model occurs resonant, a noise transmitted by the first equivalent transmission line model will be conducted to the first resonance circuit model and suppressed by the first resonance circuit model.

In one embodiment of the present invention, wherein the first resonance circuit model further comprises a first resistor, the first resistor, the first inductor, and the first capacitor are connected in series between the input end and the return path.

In one embodiment of the present invention, wherein the equivalent circuit further comprises a second resonance circuit model, the second resonance circuit model comprises a second inductor and a second capacitor, the second inductor and the second capacitor are connected in series between the output end and the return path, the noise transmitted by the first equivalent transmission line model will be conducted to the second resonance circuit model and suppressed by the second resonance circuit model when the second resonance circuit model occurs resonant.

In one embodiment of the present invention, the equivalent circuit further comprises a second resonance circuit model, a second equivalent transmission line model, and a third resonance circuit model, the second equivalent transmission line model comprises a second master transmission conductor and a second slave transmission conductor, the first master transmission conductor is connected to the output end via the second master transmission conductor, the second slave transmission conductor is disposed on the return path, the second resonance circuit model comprises a second inductor and a second capacitor, the second inductor is connected at an end thereof to the first master transmission conductor and the second master transmission conductor, the second capacitor is connected at an end thereof to other end of the second inductor, and connected at other end thereof to the first slave transmission conductor and the second slave transmission conductor, the third resonance circuit model comprises a third inductor and a third capacitor, the third inductor and the third capacitor are connected in series between the output end and the return path; wherein when the second resonance circuit model or the third resonance circuit model occurs resonant, the noise transmitted by the first equivalent transmission line model or the second equivalent transmission line model will be conducted to the second resonance circuit model or the third resonance circuit model, and suppressed by the second resonance circuit model or the third resonance circuit model.

In one embodiment of the present invention, wherein the third resonance circuit model comprises a third resistor, the third resistor, the third inductor, and the third capacitor are connected in series between the output end and the return path.

DETAILED DESCRIPTION OF THE PREFERRED EMBODIMENTS

Figure 1:
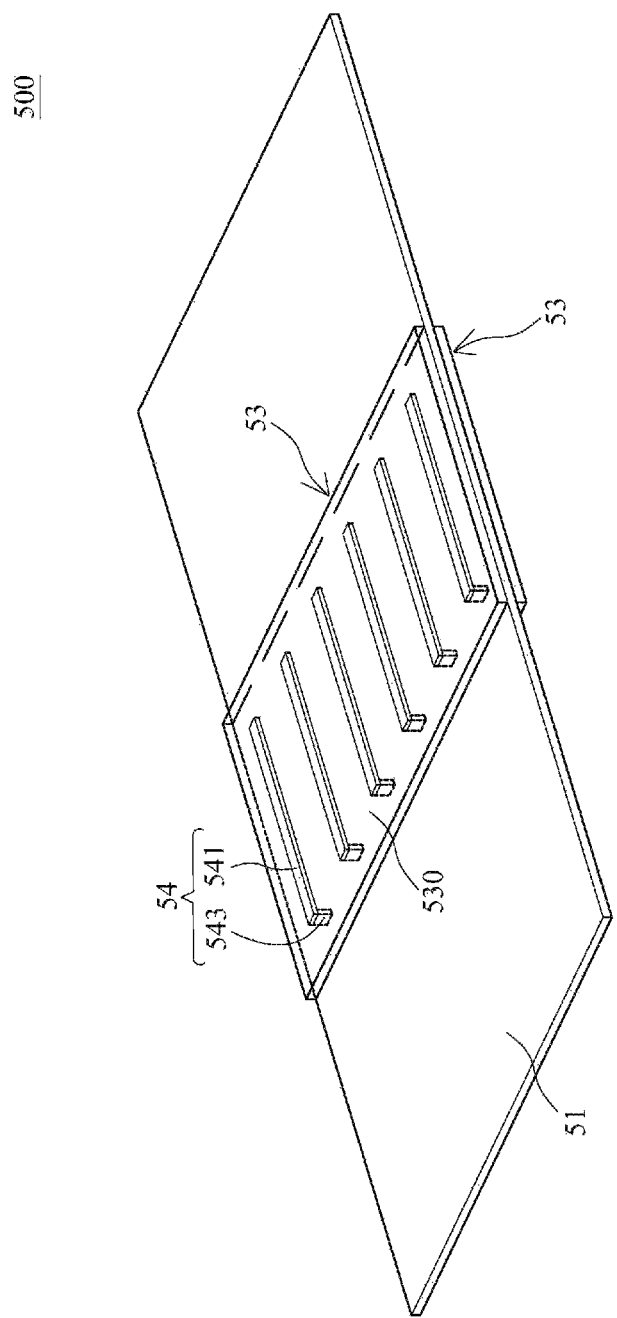
FIG. 1 is a three-dimensional structural view and a cross-section view of a noise suppression device according to one embodiment of the present invention.
Figure 2:
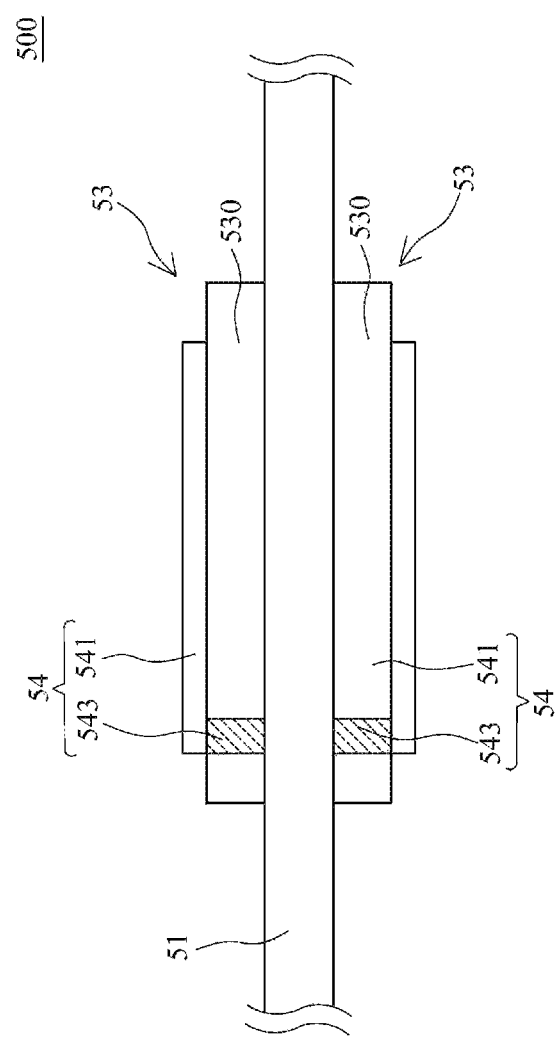
FIG. 2 is a cross-section view of a noise suppression device according to one embodiment of the present invention.

Referring to FIG. 1 and FIG. 2, there are shown a three-dimensional structural view and a cross-section view of a noise suppression device according to one embodiment of the present invention. As shown in FIG. 1 and FIG. 2, the noise suppression device 500 is configured in the inside or the outside of an electronic product, and used to suppress a noise in the electronic product. The noise suppression device 500 comprises a metal plate 51 and at least one first resonance unit 53. The metal plate 51 is as a noise transmission path, and connected to a ground of the electronic product. The metal plate 51 is grounded in direct current, the noise can be transmitted on the metal plate 51 when the noise suppression device 500 is operated in a high-frequence. The first resonance unit 53 comprises a plurality of first resonator 54. Each of the first resonators 54 comprising a first metal segment 541 and at least one first conductive connection segment 543. The first metal segment 541 is connected at an end thereof to the first conductive connection segment 543. When the first resonance unit 53 is configured on the metal plate 51, each of the first metal segments 541 is connected to the metal plate 51 via the corresponding first conductive connection segment 543. In one embodiment of the present invention, each of the first metal segments 541 is connected to the metal plate 51 via a single first conductive connection segment 543. In another embodiment of the present invention, each of the first metal segments 541 is connected to the metal plate 51 via a plurality of first conductive connection segments 543.

In one embodiment of the present invention, each of the first resonators 54 is directly soldered on the metal plate 51 via the first conductive connection segment 543. In another embodiment of the present invention, the first resonance unit 53 further comprises a first substrate 530, the first metal segments 541 are disposed on a surface of the first substrate 530, the first conductive connection segments 543 are passing through the first substrate 530, thereby the first resonance unit 53 is configured on the metal plate 51 via the first substrate 530. Besides, the first resonance unit 53 may be a dismountable element. The first resonance unit 53, by the first substrate 530, is fixed on the metal plate 51 by a way of pasting, or by at least one fixed element.

In the present embodiment, the first resonators 54 are designed as reflective resonators. When the first resonators 54 occur resonant, a noise transmitted on the metal plate 51 will be conducted to the first resonators 54 and reflected by the first resonators 54.

In one embodiment of the present invention, the upper surface of the metal plate 51 is provided with at least one first resonance unit 53. In another embodiment of the present invention, the upper surface and the lower surface of the metal plate 51 are provided with at least one first resonance unit 53, respectively.

Figure 3:
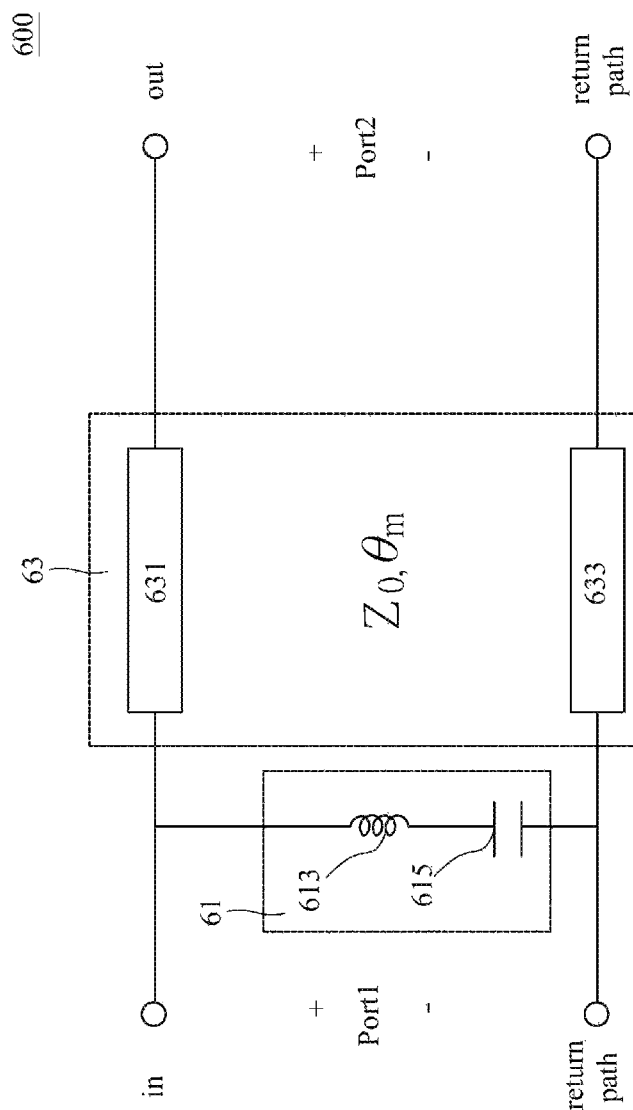
FIG. 3 is a circuit diagram of an equivalent circuit of the noise suppression device shown in FIG. 1 according to one embodiment of the present invention.

Referring to FIG. 3, there is shown a circuit diagram of an equivalent circuit of the noise suppression device shown in FIG. 1 according to one embodiment of the present invention. As shown in FIG. 3, the equivalent circuit 600 comprises at least one first resonance circuit model 61 and a first equivalent transmission line model 63. The first resonance circuit model 61 comprises a first inductor 613 and a first capacitor 615. The first inductor 613 and the first capacitor 615 are an LC equivalent circuit formed by the first metal segment 541 and the first conductive connection segment 543. In one embodiment of the present invention, the first inductor 613 and the first capacitor 615 are connected in series between an input end and a return path. In other embodiment of the present invention, otherwise, the first inductor 613 and the first capacitor 615 are connected in series between an output end and the return path. The first equivalent transmission line model 63 comprises a first master transmission conductor 631 and a first slave transmission conductor 633. The first master transmission conductor 631 is an equivalent element of the metal plate 51, and the first slave transmission conductor 633 is an equivalent element of a reference metal surface or an earth ground. The first master transmission conductor 631 is grounded in direct current. The noise can be transmitted on the first master transmission conductor 631 and the first slave transmission conductor 633 when the the equivalent circuit 600 is operated in a high-frequence. The first master transmission conductor 631 is connected at one port thereof to the input end, and connected at other port thereof to an output end. The first slave transmission conductor 633 is disposed on the return path. When the first resonance circuit model 61 occurs resonant, a noise transmitted by the first equivalent transmission line model 63 will be conducted to the first resonance circuit model 61 and reflected by the first resonance circuit model 61. In another embodiment of the present invention, of course, the first inductor 613 and the first capacitor 615 can be also connected in series between the first master transmission conductor 631 and the first slave transmission conductor 633.

Figure 4:
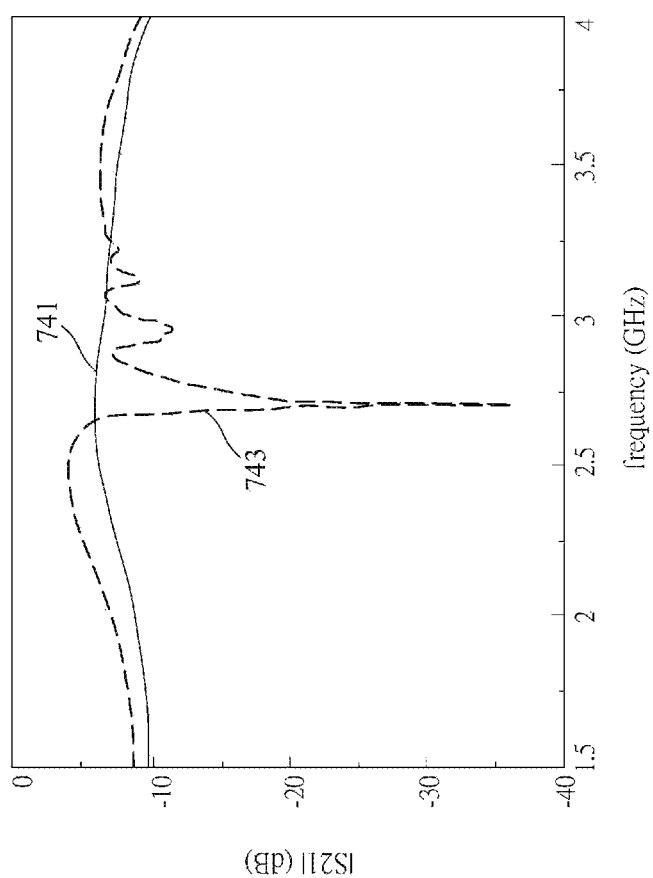
FIG. 4 is a waveform diagram obtained by proceeding the measurement for transmission coefficient of the noise suppression device shown in FIG. 1 of the present invention.

Referring to FIG. 4, there is shown a waveform diagram obtained by proceeding the measurement for transmission coefficient of the noise suppression device shown in FIG. 1 of the present invention. As shown in FIG. 4, a curve 741 of a transmission coefficient |S21| is obtained by the measurement for the transmission coefficient of the metal plate 51 without the noise suppression device 500, and a curve 743 of a transmission coefficient |S21| is obtained by the measurement for the transmission coefficient of the metal plate 51 with the noise suppression device 500.

Between the frequency band of 2.46 GHz to 2.53 GHz, the transmission coefficient |S21| of the curve 743 will be less about −20 dB than the transmission coefficient |S21| of the curve 741. Thus, after the metal plate 51 is provided with the noise suppression device 500, it is possible to obtain a good noise suppression effect in a specific frequency band.

Figure 5:
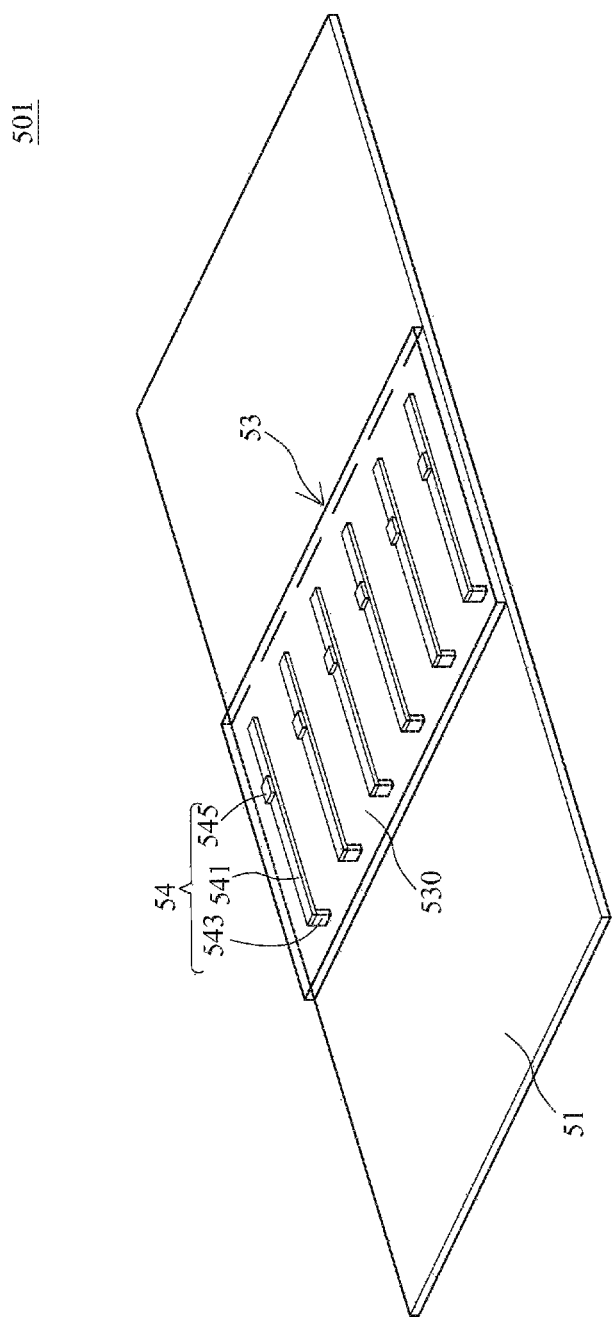
FIG. 5 is a three-dimensional structural view of a noise suppression device according to another embodiment of the present invention.
Figure 6:
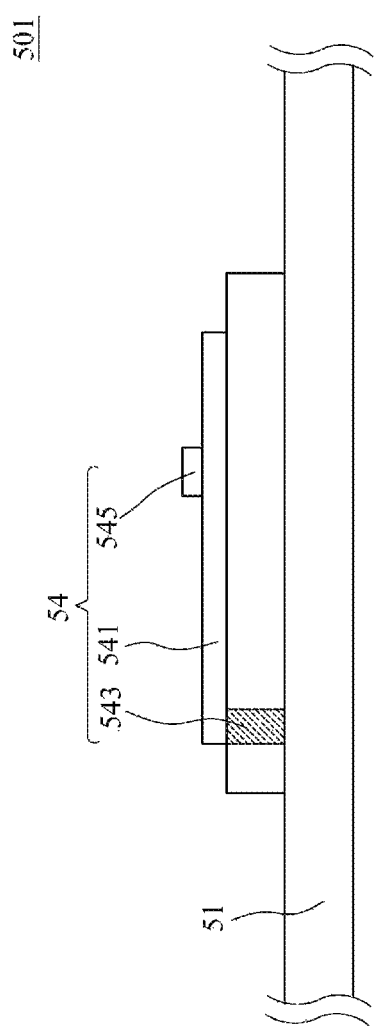
FIG. 6 is a cross-section view of a noise suppression device according to another embodiment of the present invention.

Referring to FIG. 5 and FIG. 6, there are shown a three-dimensional structural view and a cross-section view of a noise suppression device according to another embodiment of the present invention. As shown in FIG. 5 and FIG. 6, compared to the first resonator 54 of the noise suppression device 500 of the above embodiment, the first resonator 54 of the noise suppression device 501 of the present embodiment further comprises at least one first resistor 545. The first resistor 545 is disposed on the first metal segment 541 and electrically connected to the first metal segment 541.

The first resonator 54 of the present embodiment is designed as an absorption resonator. When the first resonator 54 occurs resonant, a noise transmitted on the metal plate 51 will be conducted to the first resonator 54 and absorbed or dissipated by the first resistor 545 of the first resonator 54.

Figure 7:
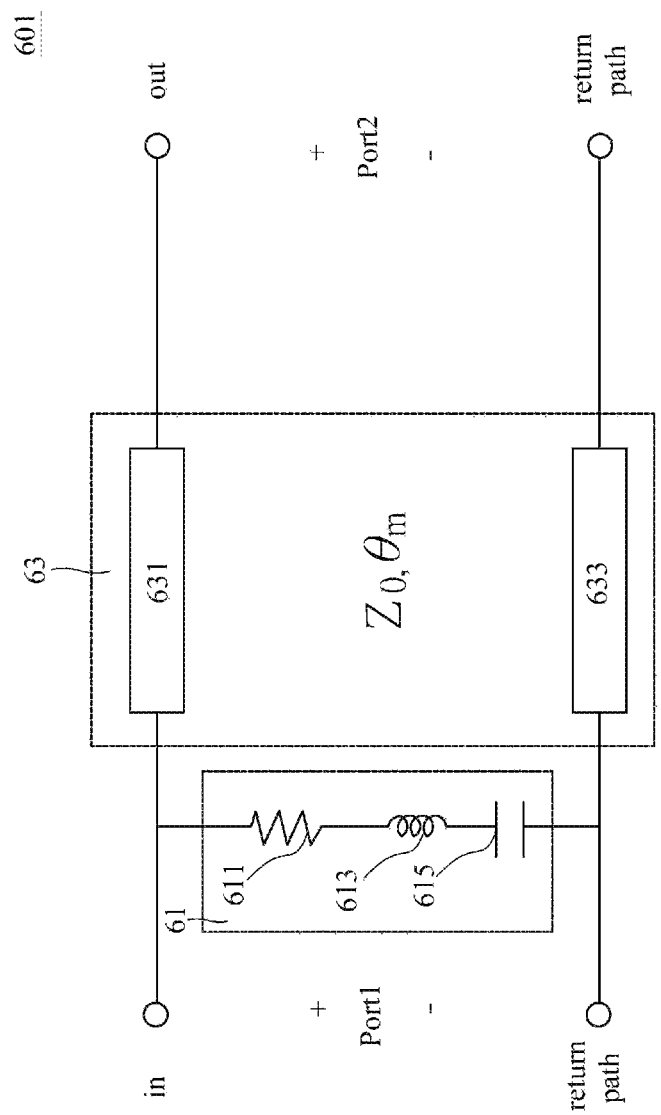
FIG. 7 is a circuit diagram of an equivalent circuit of the noise suppression device shown in FIG. 5 according to another embodiment of the present invention.

Referring to FIG. 7, there is shown a circuit diagram of an equivalent circuit of the noise suppression device shown in FIG. 5 according to another embodiment of the present invention. As shown in FIG. 7, compared to the first resonance circuit model 61 of the equivalent circuit 600 in FIG. 3, the first resonance circuit model 61 of the equivalent circuit 601 in FIG. 7 further comprises at least one first resistor 611. The first resistor 611, the first inductor 613, and the first capacitor 615 are an RLC equivalent circuit formed by the first metal segment 541, the first conductive connection segment 543, and the first resistor 545. The first resistor 611, the first inductor 613, and the first capacitor 615 are connected in series between the input end and the return path.

The first resonance circuit model 61 of the present embodiment is designed as a resonance circuit model of an absorption type. When the first resonance circuit model 61 occurs resonant, a noise transmitted by the first equivalent transmission line model 63 will be conducted to the first resonance circuit model 61 and absorbed by the first resistor 611 of the first resonance circuit model 61.

Figure 8:
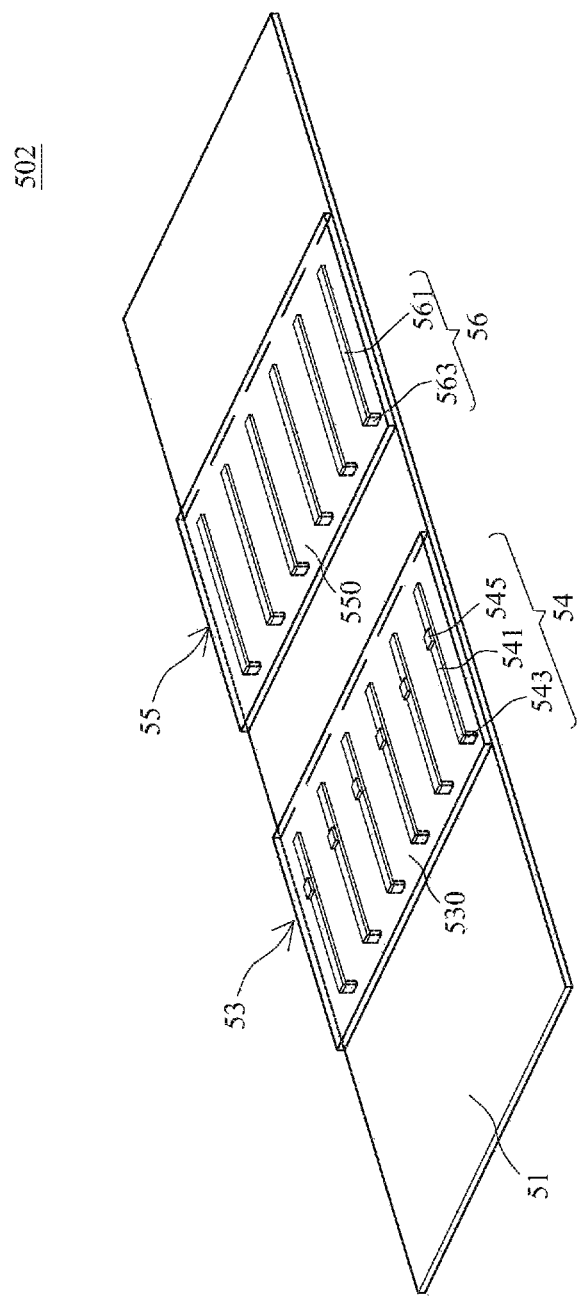
FIG. 8 is a three-dimensional structural view of a noise suppression device according to another embodiment of the present invention.

Referring to FIG. 8, there is shown a three-dimensional structural view of a noise suppression device according to another embodiment of the present invention. As shown in FIG. 8, the noise suppression device 502 comprises a metal plate 51, at least one first resonance unit 53, and a second resonance unit 55.

The first resonance unit 53 comprises a plurality of first resonator 54. Each of the first resonators 54 comprising a first metal segment 541, at least one first conductive connection segment 543, and a first resistor 545. The first metal segment 541 is connected at an end thereof to the first conductive connection segment 543. The first resistor 545 is disposed on the first metal segment 541, and electrically connected to the first metal segment 541. When the first resonance unit 53 is configured on the metal plate 51, each of the first metal segments 541 is connected to the metal plate 51 via the corresponding first conductive connection segment 543.

The second resonance unit 55 comprises a plurality of second resonators 56. Each of the second resonators 56 comprising a second metal segment 561 and at least one second conductive connection segment 563. The second metal segment 561 is connected to the second conductive connection segment 563. When the second resonance unit 55 is configured on the metal plate 51, each of the second metal segments 561 is connected to the metal plate 51 via the corresponding second conductive connection segment 563. In one embodiment of the present invention, each of the second metal segments 561 is connected to the metal plate 51 via a single second conductive connection segment 563. In another embodiment of the present invention, each of the second metal segments 561 is connected to the metal plate 51 via a plurality of second conductive connection segments 563.

In one embodiment of the present invention, each of the first resonators 54 and each of the second resonators 56 are directly soldered on the metal plate 51 via the first conductive connection segment 543 and the second conductive connection segment 563, respectively.

In another embodiment of the present invention, on the contrary, the first resonance unit 53 further comprises a first substrate 530, and the second resonance unit 55 further comprises a second substrate 550. The first metal segments 541 are disposed on a surface of the first substrate 530, the first conductive connection segments 543 are passing through the first substrate 530. The second metal segments 561 are disposed on a surface of the second substrate 550, the second conductive connection segments 563 are passing through the second substrate 550. The first resonance unit 53 and the second resonance unit 55 may be dismountable elements, they may be fixed on the metal plate 51 via the first substrate 530 and the second substrate 550 in a way of pasting or by a way of fixed element.

When the noise suppression device 502 is operating, the second resonance unit 55 is for reflecting the noise transmitted on the metal plate 51, the first resistors 545 of the first resonance unit 53 is for absorbing the noise reflected by the second resonance unit 55, thereby the noise can be suppressed by the noise suppression device 502.

Figure 9:
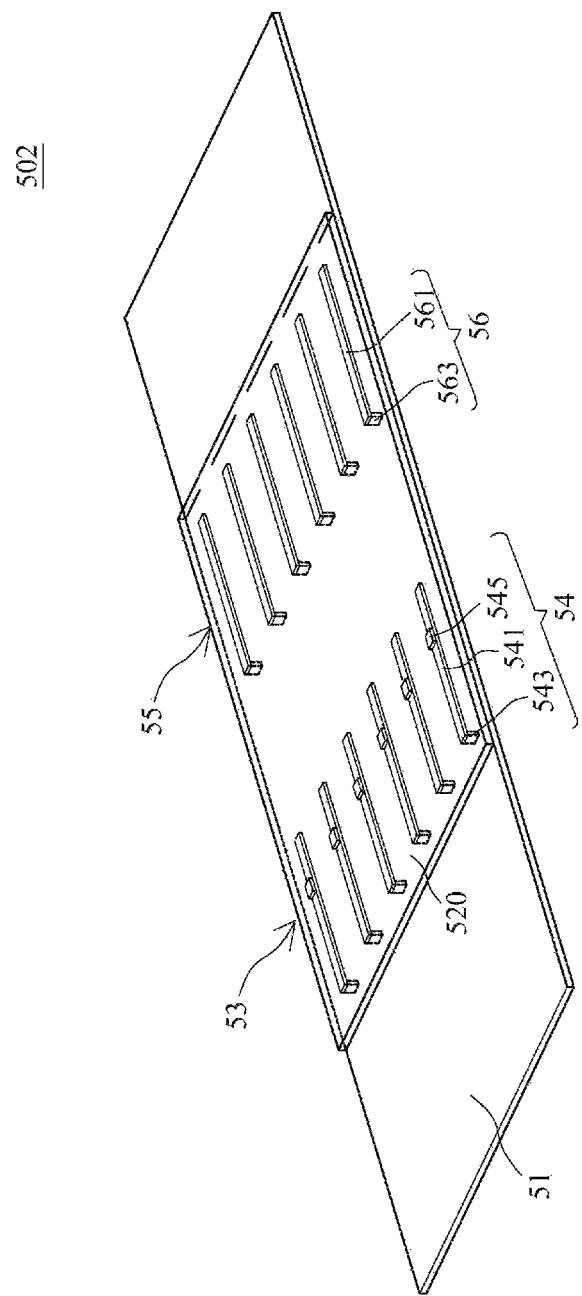
FIG. 9 is a three-dimensional structural view of a noise suppression device according to another embodiment f the present invention.

Referring to FIG. 9, there is shown a three-dimensional structural view of a noise suppression device according to another embodiment of the present invention. In the embodiment of FIG. 8, the first resonators 54 of the first resonance unit 53 and the second resonators 56 of the second resonance unit 55 are respectively disposed on the different substrates 530, 550, for example, the first resonators 54 is disposed on the first substrate 530, and the second resonators 56 is disposed on the second substrate 550.

In the embodiment of FIG. 9, on the contrary, the first resonators 54 of the first resonance unit 53 and the second resonators 56 of the second resonance unit 55 may be disposed on the same substrate 520. The first metal segments 541 and the second metal segments 561 are disposed on a surface of the substrate 520, the first conductive connection segments 543 and the second conductive connection segments 563 are passing through the substrate 520, thereby the first resonance unit 53 and the second resonance unit 55 are configured on the metal plate 51 via the substrate 520. In one embodiment of the present invention, the substrate 520 is a soft substrate or a flexible substrate.

Figure 10:
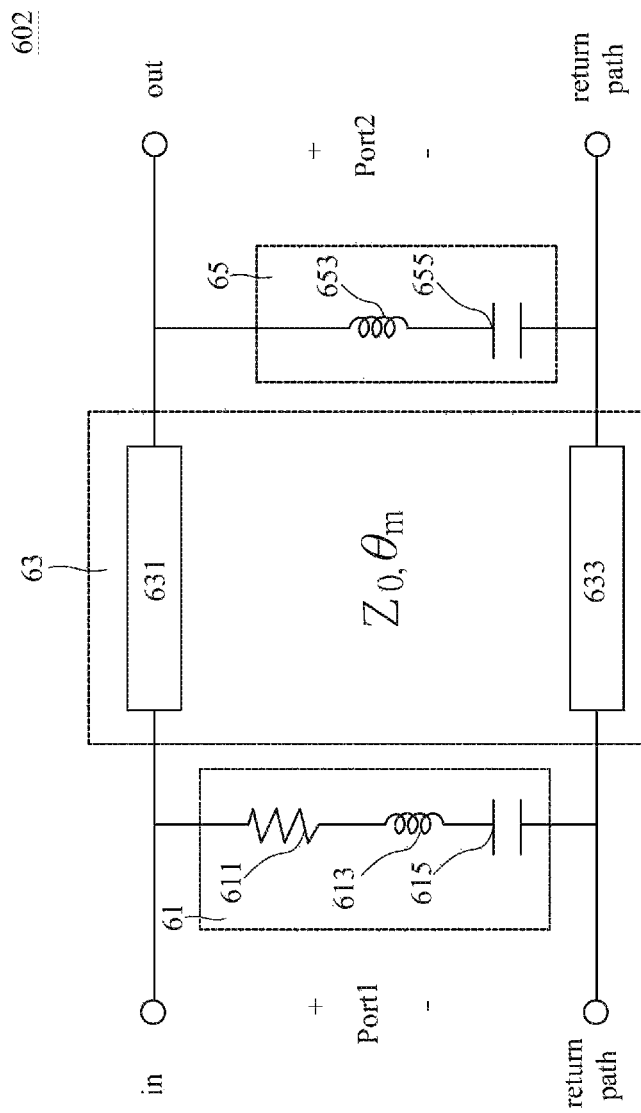
FIG. 10 is a circuit diagram of an equivalent circuit of the noise suppression device shown in FIG. 8 according to another embodiment of the present invention.

Referring to FIG. 10, there is shown a circuit diagram of an equivalent circuit of the noise suppression device shown in FIG. 8 according to another embodiment of the present invention. As shown in FIG. 10, the equivalent circuit 602 comprises a first resonance circuit model 61, a first equivalent transmission line model 63, and a second resonance circuit model 65.

The first resonance circuit model 611 comprises a first resistor 611, a first inductor 613, and a first capacitor 615. The first resistor 611, the first inductor 613, and the first capacitor 615 are an RLC equivalent circuit formed by the first metal segment 541, the first conductive connection segment 543, and the first resistor 545. The first resistor 611, the first inductor 613 and the first capacitor 615 are connected in series between an input end and a return path. The first equivalent transmission line model 63 comprises a first master transmission conductor 631 and a first slave transmission conductor 633. The first master transmission conductor 631 is an equivalent element of the metal plate 51, and the first slave transmission conductor 633 is an equivalent element of a reference metal surface or an earth ground. The first master transmission conductor 631 is connected at one port thereof to the input end, and connected at other port thereof to the output end. The first slave transmission conductor 633 is disposed on the return path. The second resonance circuit model 65 comprises a second inductor 653 and a second capacitor 655. The second inductor 653 and the second capacitor 655 are an LC equivalent circuit formed by the second metal segment 561 and the second conductive connection segment 563. The second inductor 653 and the second capacitor 655 are connected in series between an output end and the return path.

When the second resonance circuit model 65 occurs resonant, a noise transmitted by the first equivalent transmission line model 63 will be conducted to the second resonance circuit model 65 and reflected by the second resonance circuit model 65. When the first resonance circuit model 61 occurs resonant, a noise transmitted by the first equivalent transmission line model 63 or a noise reflected by the second resonance circuit model 65 will be conducted to the first resonance circuit model 61, and therefore absorbed by the first resistor 611 of the first resonance circuit model 61.

Figure 11:
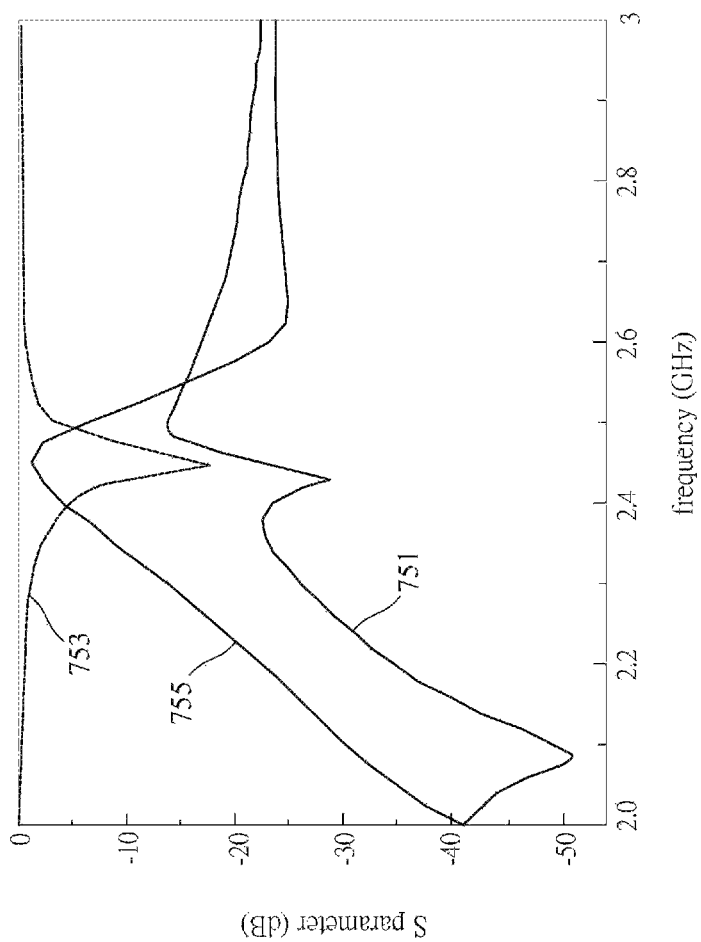
FIG. 11 is a waveform diagram obtained by proceeding the measurement of S parameter for the noise suppression device shown in FIG. 8 of the present invention.

Referring to FIG. 11, there is shown a waveform diagram obtained by proceeding the measurement of S parameter for the noise suppression device shown in FIG. 8 of the present invention. As shown in FIG. 11, a curve 751 of an input reflection coefficient |S11|, a curve 753 of a transmission coefficient |S21|, and a curve 755 of an output reflection coefficient |S22| are obtained by the measurement of the input reflection coefficient |S11|, the transmission coefficient |S21|, and the output reflection coefficient |S22| with respect to the noise in the noise suppression device 502.

It is known from the curve 751 of the input reflection coefficient |S11| and the curve 753 of the transmission coefficient |S21|, the noise suppression device 502 can have a better absorption or dissipation effect for the input noise between the frequency band of 2.35 GHz to 2.556 Hz. Furthermore, it is known from the curve 755 of the output reflection coefficient |S22|, the noise suppression device 502 can have a better reflection effect for the output noise between the frequency band of 2.35 GHz to 2.55 GHz.

Figure 12:
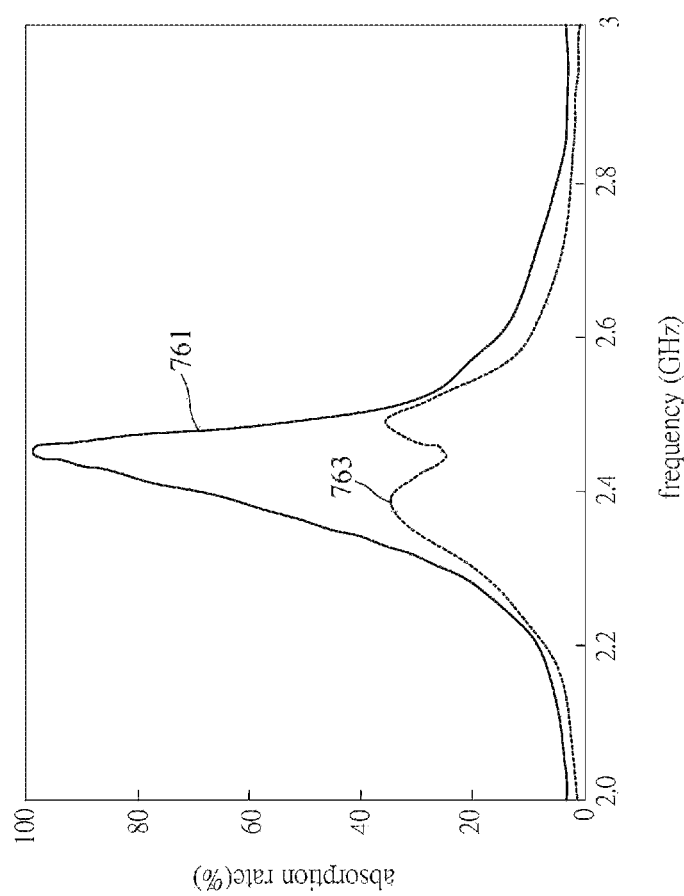
FIG. 12 is a waveform diagram of noise absorption rate of the noise suppression device shown in FIG. 8 of the present invention.

Referring to FIG. 12, there is shown a waveform diagram of noise absorption rate of the noise suppression device shown in FIG. 8 of the present invention. As shown in FIG. 12, the curve 761 is a curve of noise absorption rate of input end of the noise suppression device 502, and the curve 763 is a curve of noise absorption rate of output end of the noise suppression device 502.

As shown in the curve 761, the noise suppression device 502 will have more than 50% absorption rate for the inputted noise in the input end between the frequency band of 2.35 GHz to 2.55 GHz because it is provided at the input end thereof with the first resonance unit 53 of an absorption type. As shown in the curve 763, the noise suppression device 502 does not generate a significantly absorption effect for the inputted noise in the input end between the frequency band of 2.35 GHz to 2.55 GHz because it is not provided with a resonance unit of an absorption type at the input end thereof.

Figure 13:
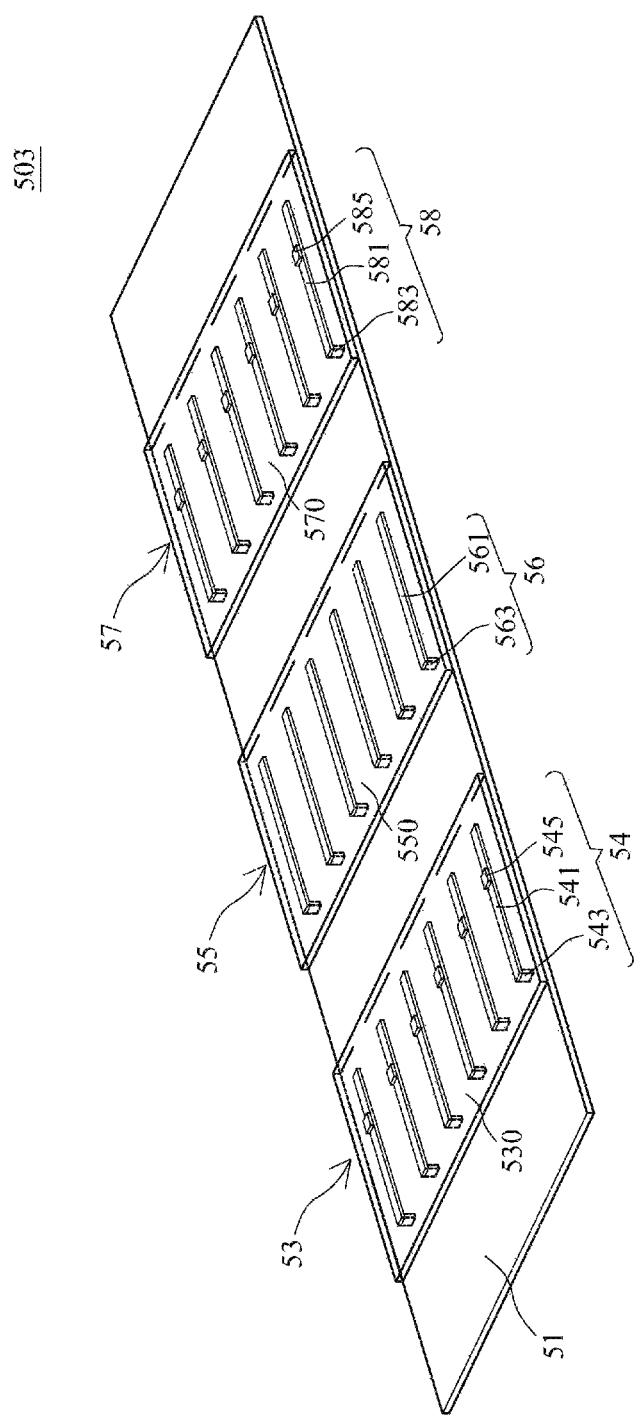
FIG. 13 is a three-dimensional structural view of a noise suppression device according to another embodiment of the present invention.

Referring to FIG. 13, there is shown a three-dimensional structural view of a noise suppression device according to another embodiment of the present invention. As shown in FIG. 13, the noise suppression device 503 comprises a metal plate 51, at least one first resonance unit 53, a second resonance unit 55, and a third resonance unit 57.

The first resonance unit 53 comprises a plurality of first resonator 54. Each of the first resonators 54 comprising a first metal segment 541, at least one first conductive connection segment 543, and a first resistor 545. The first metal segment 541 is connected at an end thereof to the first conductive connection segment 543. The first resistor 545 is disposed on the first metal segment 541, and electrically connected to the first metal segment 541. When the first resonance unit 53 is configured on the metal plate 51, each of the first metal segments 541 is connected to the metal plate 51 via the corresponding first conductive connection segment 543.

The second resonance unit 55 comprises a plurality of second resonator 56. Each of the second resonators 56 comprising a second metal segment 561 and at least one second conductive connection segment 563. The second metal segment 561 is connected to the second conductive connection segment 563. When the second resonance unit 55 is configured on the metal plate 51, each of the second metal segments 561 is connected to the metal plate 51 via the corresponding second conductive connection segment 563.

The third resonance unit 57 comprises a plurality of third resonator 58. Each of the third resonators 58 comprising a third metal segment 581, at least one third conductive connection segment 583, and a third resistor 585. The third metal segment 581 is connected at an end thereof to the third conductive connection segment 583. The third resistor 585 is disposed on the third metal segment 581, and electrically connected to the third metal segment 581. When the third resonance unit 57 is configured on the metal plate 51, each of the third metal segments 581 is connected to the metal plate 51 via the corresponding third conductive connection segment 583. In one embodiment of the present invention, each of the third metal segments 581 is connected to the metal plate 51 via a single third conductive connection segment 583. In another embodiment of the present invention, each of the third metal segments 581 is connected to the metal plate 51 via a plurality of third conductive connection segments 583.

In one embodiment of the present invention, each of the first resonators 54, each of the second resonators 56, and each of the third resonators 58 are directly soldered on the metal plate 51 via the first conductive connection segment 543, the second conductive connection segment 563, and the third conductive connection segment 583, respectively.

In another embodiment of the present invention, on the contrary, the first resonance unit 53 further comprises a first substrate 530, the second resonance unit 55 further comprises a second substrate 550, and the third resonance unit 57 further comprises a third substrate 570. The first metal segments 541 are disposed on a surface of the first substrate 530, the first conductive connection segments 543 are passing through the first substrate 530. The second metal segments 561 are disposed on a surface of the second substrate 550, the second conductive connection segments 563 are passing through the second substrate 550. The third metal segments 581 are disposed on a surface of the third substrate 570, the third conductive connection segments 583 are passing through the third substrate 570. The first resonance unit 53, the second resonance unit 55, and the third resonance unit 57 may be dismountable elements, they may be fixed on the metal plate 51 via the first substrate 530, the second substrate 550, and the third substrate 570 in a way of pasting or by a way of fixed element, respectively. In one embodiment of the present invention, the first substrate 530, the second substrate 550, or the third substrate 570 is a soft substrate or a flexible substrate.

When the noise suppression device 503 is operating, the second resonance unit 55 is for reflecting the noise transmitted on the metal plate 51, the first resistors 545 and the third resistors 585 of the first resonance unit 53 and the third resonance unit 57 are for absorbing the noise reflected by the second resonance unit 55, respectively, thereby the noise can be suppressed by the noise suppression device 503.

Figure 14:
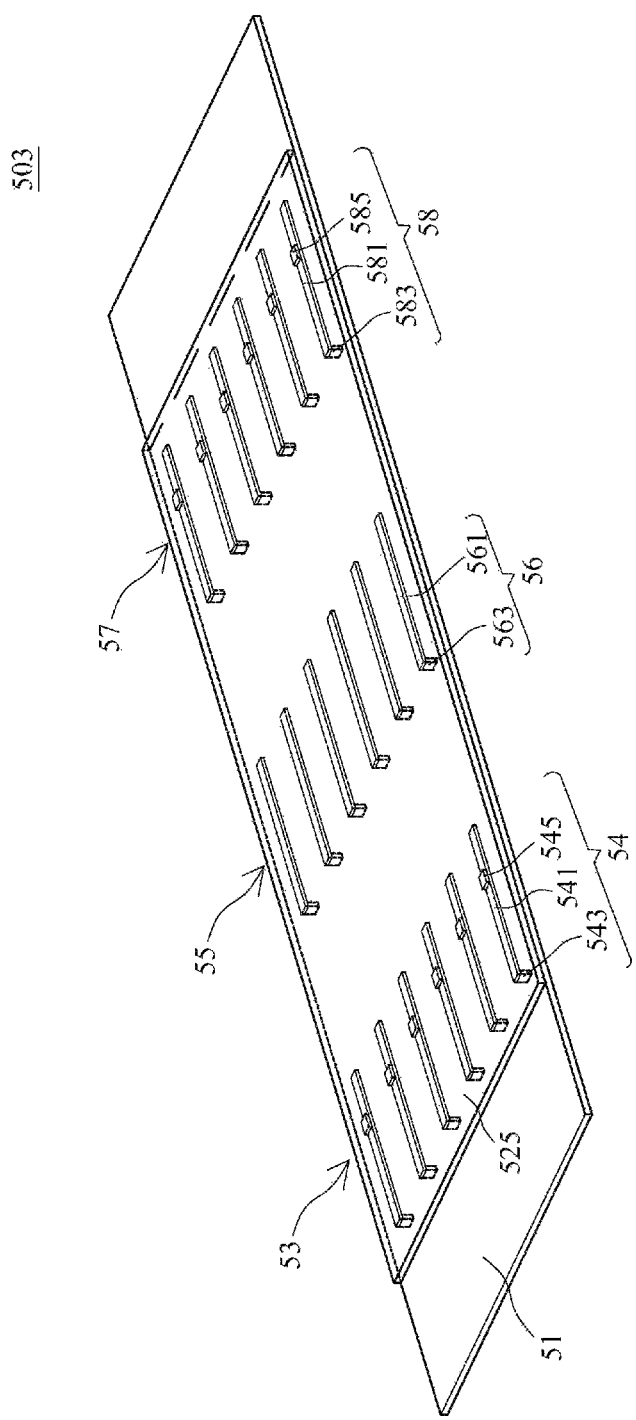
FIG. 14 is a three-dimensional structural view of a noise suppression device according to another embodiment of the present invention.

Referring to FIG. 14, there is shown a three-dimensional structural view of a noise suppression device according to another embodiment of the present invention. In the embodiment of FIG. 13, the first resonators 54 of the first resonance unit 53, the second resonators 56 of the second resonance unit 55, and the third resonators 58 of the third resonance unit 57 are respectively disposed on the different substrates, for example, the first resonators 54 are disposed on the first substrate 530, the second resonators 56 are disposed on the second substrate 550, and the third resonators 58 are disposed on the third substrate 570.

In the embodiment of FIG. 14, on the contrary, the first resonators 54 of the first resonance unit 53, the second resonators 56 of the second resonance unit 55, and the third resonators 58 of the third resonance unit 57 may be disposed on the same substrate 525. The first metal segments 541, the second metal segments 561, and the third metal segments 581 are disposed on a surface of the substrate 525, the first conductive connection segments 543, the second conductive connection segments 563, and the third conductive connection segments 583 are passing through the substrate 525, thereby the first resonance unit 53, the second resonance unit 55, and the third resonance unit 57 are configured on the metal plate 51 via the substrate 525. In one embodiment of the present invention, the substrate 525 is a soft substrate or a flexible substrate.

Figure 15:
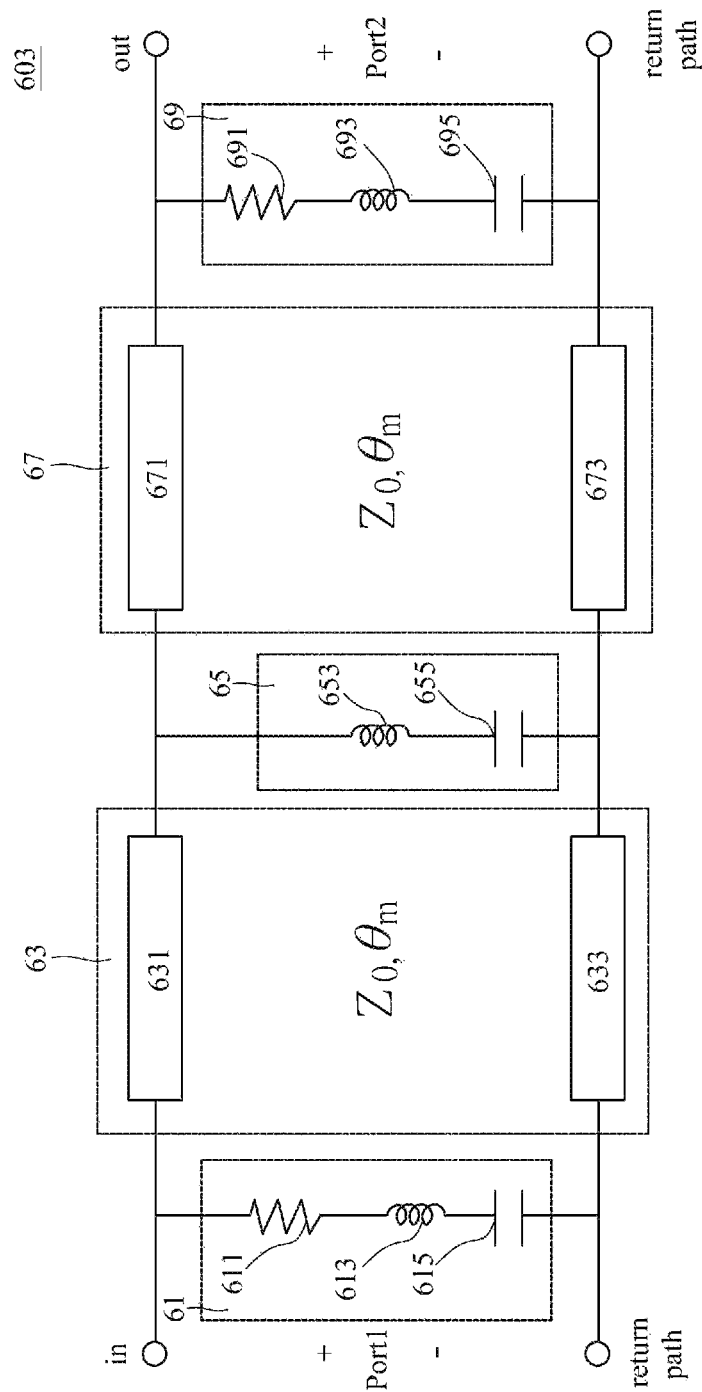
FIG. 15 is a circuit diagram of an equivalent circuit of the noise suppression device shown in FIG. 13 according to another embodiment of the present invention.

Referring to FIG. 15, there is shown a circuit diagram of an equivalent circuit of the noise suppression device shown in FIG. 13 according to another embodiment of the present invention. As shown in FIG. 15, the equivalent circuit 603 comprises a first resonance circuit model 61, a first equivalent transmission line model 63, a second resonance circuit model 65, a second equivalent transmission line model 67, and a third resonance circuit model 67.

The first resonance circuit model 61 comprises a first resistor 611, a first inductor 613, and a first capacitor 615. The first resistor 611, the first inductor 613, and the first capacitor 615 are an RLC equivalent circuit formed by the first metal segment 541, the first conductive connection segment 543, and the first resistor 545. The first resistor 611, the first inductor 613 and the first capacitor 615 are connected in series between an input end and a return path.

The first equivalent transmission line model 63 comprises a first master transmission conductor 631 and a first slave transmission conductor 633. The second equivalent transmission line model 67 comprises a second master transmission conductor 671 and a second slave transmission conductor 673. The first master transmission conductor 631 and the second master transmission conductor 671 are equivalent elements of the metal plate 51, and the first slave transmission conductor 633 and the second slave transmission conductor 673 are equivalent elements of a reference metal surface or an earth ground. The first master transmission conductor 631 and the second master transmission conductor 671 are connected in serial between the input end and the output end, and the first slave transmission conductor 633 and the second slave transmission conductor 673 are connected in serial on the return path. The first master transmission conductor 631 and the second master transmission conductor 671 are grounded in direct current. The noise can be transmitted on the first master transmission conductor 631, the second master transmission conductor 671, the first slave transmission conductor 633, and the second slave transmission conductor 673 when the the equivalent circuit 603 is operated in a high-frequency.

The second resonance circuit model 65 comprises a second inductor 653 and a second capacitor 655. The second inductor 653 and the second capacitor 655 are an LC equivalent circuit formed by the second metal segment 561 and the second conductive connection segment 563. The second inductor 653 is connected at an end thereof to the first master transmission conductor 631 and the second master transmission conductor 671. The second capacitor 655 is connected at an end thereof to other end of the second inductor 653, and connected at other end thereof to the first slave transmission conductor 633 and the second slave transmission conductor 673.

The third resonance circuit model 69 comprises a third resistor 691, a third inductor 693, and a third capacitor 695. The third resistor 691, the third inductor 693, and the third capacitor 695 are an RLC equivalent circuit formed by the third metal segment 581, the third conductive connection segment 583, and the third resistor 585. The third resistor 691, the third inductor 693, and the third capacitor 695 are connected in series between the input end and the return path.

When the second resonance circuit model 65 occurs resonant, a noise transmitted by the first equivalent transmission line model 63 or the second equivalent transmission line model 67 will be conducted to the second resonance circuit model 65 and reflected by the second resonance circuit model 65. When the first resonance circuit model 61 or the third resonance circuit model 69 occurs resonant, a noise transmitted by the first equivalent transmission line model 63 or the second equivalent transmission line model 67, or a noise reflected by the second resonance circuit model 65 will be conducted to the first resonance circuit model 61 or the third resonance circuit model 69, and therefore absorbed by the first resistor 611 of the first resonance circuit model 61 or the third resistor 691 of the third resonance circuit model 69.

Figure 16:
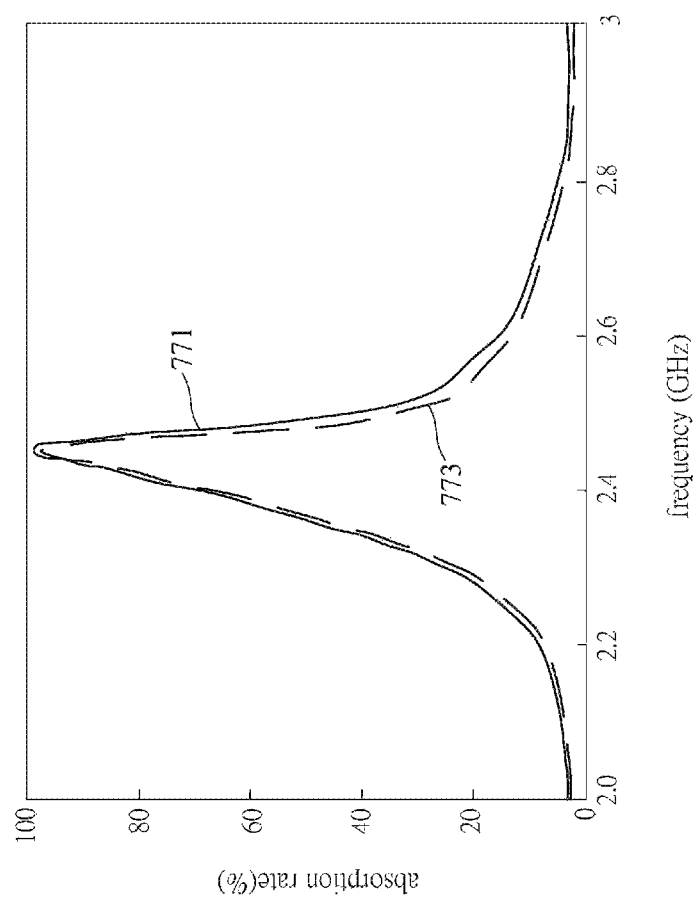
FIG. 16 is a waveform diagram of noise absorption rate of the noise suppression device shown in FIG. 13 of the present invention.

Referring to FIG. 16, there is shown a waveform diagram of noise absorption rate of the noise suppression device shown in FIG. 13 of the present invention. As shown in FIG. 16, the curve 771 is a curve of noise absorption rate of input end of the noise suppression device 503, and the curve 773 is a curve of noise absorption rate of output end of the noise suppression device 503.

As shown in the curve 771, the noise suppression device 503 will have more than 50% absorption rate for the inputted noise in the input end between the frequency band of 2.35 GHz to 2.55 GHz because it is provided at the input end thereof with the first resonance unit 53 of an absorption type. As shown in the curve 773, the noise suppression device 503 will have more than 50% absorption rate for the inputted noise in the output end between the frequency band of 2.35 GHz to 2.55 GHz because it is provided at the output end thereof with the third resonance unit 57 of an absorption type. Accordingly, the noise suppression device 503 can achieve the effect for bidirectional absorbing the noise via the resonance units 53 and 57 provided at the input end and the output end.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

What is claimed is:
1. A noise suppression device for application in an electronic product, the noise suppression device comprising:
  a metal plate providing a noise transmission path, and connected to a ground of the electronic product; and at least one first resonance unit including a plurality of first resonators, each of the plurality of first resonators including:
a first metal segment,
a first conductive connection segment that is connected to the first metal segment, and
at least one first resistor disposed on the first metal segment and separated from the first conductive connection segment by the first metal segment;
wherein, when the at least one first resonance unit is configured on the metal plate, each of the first metal segments is connected to the metal plate via the corresponding first conductive connection segment; and
wherein, when the plurality of first resonators undergo resonance, a noise transmitted on the metal plate is conducted to the plurality of first resonators and suppressed by the plurality of first resonators.

2. The noise suppression device according to claim 1, wherein the first resonance unit further includes a first substrate, the first metal segments being disposed on a surface of the first substrate, the first conductive connection segments passing through the first substrate, the at least one first resonance unit being configured on the metal plate via the first substrate.

3. The noise suppression device according to claim 2, wherein the first substrate is a soft substrate or a flexible substrate.

4. The noise suppression device according to claim 1, wherein the metal plate is grounded in direct current, and the noise is transmittable on the metal plate when the noise suppression device is operated in a high frequency.

5. The noise suppression device according to claim 1, wherein an upper surface and a lower surface of the metal plate are provided with the at least one first resonance unit, respectively.

6. The noise suppression device according to claim 1, further comprising at least one second resonance unit including a plurality of second resonators, each of the plurality of second resonators including a second metal segment and a second conductive connection segment that is connected to the second metal segment,
wherein each of the second metal segments is connected to the metal plate via the corresponding second conductive connection segment when the at least one second resonance unit is configured on the metal plate, and
wherein the noise transmitted on the metal plate is conducted to the plurality of second resonators and suppressed by the plurality of second resonators when the plurality of second resonators undergo resonance.

7. The noise suppression device according to claim 6, further comprising a substrate, the first metal segments and the second metal segments being disposed on a surface of the substrate, the first conductive connection segments and the second conductive connection segments passing through the substrate, the at least one first resonance unit and the at least one second resonance unit being configured on the metal plate via the substrate.

8. The noise suppression device according to claim 6, wherein the at least one second resonance unit includes a second substrate, the second metal segments being disposed on a surface of the second substrate, the second conductive connection segments passing through the second substrate, the at least one second resonance unit being configured on the metal plate via the second substrate.

9. The noise suppression device according to claim 8, wherein the second substrate is a soft substrate or a flexible substrate.

10. The noise suppression device according to claim 6, further comprising at least one third resonance unit including a plurality of third resonators, each of the plurality of third resonators including a third metal segment and a third conductive connection segment that is connected to the third metal segment, at least one third resistor being disposed on each of the third metal segments,
wherein each of the third metal segments is connected to the metal plate via the corresponding third conductive connection segment when the at least one third resonance unit is configured on the metal plate, and
wherein the noise transmitted on the metal plate is conducted to the plurality of third resonators and suppressed by the plurality of third resonators when the plurality of third resonators undergo resonance.

11. The noise suppression device according to claim 10, wherein the at least one second resonance unit or the at least one third resonance unit is a dismountable element fixed on the metal plate by pasting or by at least one fixed element.

12. The noise suppression device according to claim 10, wherein the third resonance unit includes a third substrate, the third metal segments being disposed on a surface of the third substrate, the third conductive connection segments passing through the third substrate, the at least one third resonance unit being configured on the metal plate via the third substrate.

13. The noise suppression device according to claim 12, wherein the third substrate is a soft substrate or a flexible substrate.

14. The noise suppression device according to claim 10, further comprising a substrate,
the first metal segments, the second metal segments, and the third metal segments being disposed on a surface of the substrate,
the first conductive connection segments, the second conductive connection segments, and the third conductive connection segments passing through the substrate,
the at least one first resonance unit, the at least one second resonance unit, and the at least one third resonance unit being configured on the metal plate via the substrate.

15. The noise suppression device according to claim 14, wherein the substrate is a soft substrate or a flexible substrate.

16. A noise suppression device for application in an electronic product, the noise suppression device comprising:
a metal plate providing a noise transmission path, and connected to a ground of the electronic product; and
at least one first resonance unit including a plurality of first resonators, each of the plurality of first resonators including:
a first metal segment, and
a first conductive connection segment that is connected to the first metal segment;
wherein the first resonance unit is a dismountable element which is fixed on the metal plate by pasting or by at least one fixed element;
wherein, when the at least one first resonance unit is fixed on the metal plate, each of the first metal segments is connected to the metal plate via the corresponding first conductive connection segment; and
wherein, when the plurality of first resonators undergo resonance, a noise transmitted on the metal plate is conducted to the plurality of first resonators and suppressed by the plurality of first resonators.

17. The noise suppression device according to claim 16, wherein at least one first resistor is disposed on each of the first metal segments.

18. An equivalent circuit of a noise suppression device, comprising:
- a first equivalent transmission line model including:
  - a first master transmission conductor connected at one port thereof to an input end, and connected at another port thereof to an output end, and
  - a first slave transmission conductor disposed on a return path; and
- at least one first resonance circuit model including a first resistor, a first inductor, and a first capacitor connected in order in series between the input end and the return path;
- wherein, when the at least one first resonance circuit model undergoes resonance, a noise transmitted by the first equivalent transmission line model is conducted to the at least one first resonance circuit model and suppressed by the at least one first resonance circuit model.

19. The equivalent circuit according to claim 18, wherein the first master transmission conductor is grounded in direct current.

20. The equivalent circuit according to claim 18, further comprising a second resonance circuit model including a second inductor and a second capacitor connected in series between the output end and the return path,
- wherein the noise transmitted by the first equivalent transmission line model is conducted to the second resonance circuit model and suppressed by the second resonance circuit model when the second resonance circuit model undergoes resonance.

21. The equivalent circuit according to claim 18, further comprising:
- a second resonance circuit model including a second inductor and a second capacitor;
- a second equivalent transmission line model including a second master transmission conductor and a second slave transmission conductor, the first master transmission conductor being connected to the output end via the second master transmission conductor, the second slave transmission conductor being disposed on the return path; and
- a third resonance circuit model including a third inductor and a third capacitor connected in series between the output end and the return path;
- wherein the second inductor is connected at an end thereof to the first master transmission conductor and the second master transmission conductor,
- wherein the second capacitor is connected at an end thereof to another end of the second inductor, and connected at another end thereof to the first slave transmission conductor and the second slave transmission conductor, and
- wherein, when the second resonance circuit model or the third resonance circuit model undergoes resonance, the noise transmitted by the first equivalent transmission line model or the second equivalent transmission line model is conducted to the second resonance circuit model or the third resonance circuit model, and suppressed by the second resonance circuit model or the third resonance circuit model.

22. The equivalent circuit according to claim 21,
- wherein the third resonance circuit model includes a third resistor, and
- wherein the third resistor, the third inductor, and the third capacitor are connected in series between the output end and the return path.

* * * * *

UNITED STATES PATENT AND TRADEMARK OFFICE
CERTIFICATE OF CORRECTION

PATENT NO. : 10,566,945 B2
APPLICATION NO. : 15/795764
DATED : February 18, 2020
INVENTOR(S) : Tzong-Lin Wu, Ying-Cheng Tseng and Yen-Ju Lin It is certified that error appears in the above-identified patent and that said Letters Patent is hereby corrected as shown below:

On the Title Page

Item (72) Inventors should be corrected to read:
Tzong-Lin Wu, Taipei (TW);
Ying-Cheng Tseng, Taipei (TW);
Yen-Ju Lin, Taipei City (TW)

Signed and Sealed this
Thirty-first Day of January, 2023

Katherine Kelly Vidal
*Director of the United States Patent and Trademark Office*